United States Patent [19]

Otagiri et al.

[11] Patent Number: 5,021,287

[45] Date of Patent: Jun. 4, 1991

[54] CERAMIC GREEN SHEETS

[75] Inventors: Tadashi Otagiri; Masahiro Shirai, both of Nagoya; Minoru Ohara, Komaki; Go Suzuki, Nagoya, all of Japan

[73] Assignee: NGK Insulators, Ltd., Aichi, Japan

[21] Appl. No.: 285,413

[22] Filed: Dec. 16, 1988

[30] Foreign Application Priority Data

Dec. 24, 1987 [JP] Japan .................................. 62-327715

[51] Int. Cl.[5] .......................................... B32B 17/06
[52] U.S. Cl. .................................... 428/212; 174/258; 361/397; 428/209; 428/332; 428/337; 428/426; 428/428; 428/442; 428/446; 428/901
[58] Field of Search ............... 428/209, 212, 343, 332, 428/337, 901, 428, 446, 442, 426; 361/397; 174/68.5; 156/89; 264/63

[56] References Cited

U.S. PATENT DOCUMENTS

| | | | |
|---|---|---|---|
| 3,575,746 | 12/1967 | Cheskis et al. | 428/901 |
| 3,725,186 | 4/1973 | Lynch | 156/89 |
| 3,998,917 | 12/1976 | Adlman | 264/63 |
| 4,046,612 | 9/1977 | Warner et al. | 156/89 |
| 4,110,487 | 8/1978 | Rion | 428/428 |
| 4,207,371 | 6/1980 | Otto | 428/428 |
| 4,396,682 | 8/1983 | Mohri et al. | 428/428 |
| 4,401,709 | 8/1983 | Prabhru et al. | 428/209 |
| 4,536,435 | 8/1985 | Utsumi et al. | 428/209 |
| 4,582,745 | 4/1986 | Schnable | 428/428 |
| 4,624,896 | 12/1986 | Watanabe et al. | 428/428 |
| 4,632,846 | 12/1986 | Fujinaka et al. | 427/96 |
| 4,656,071 | 4/1987 | Virkar | 428/428 |
| 4,677,009 | 6/1987 | Virkar | 428/428 |
| 4,767,672 | 8/1988 | Fujinka et al. | 428/446 |
| 4,806,334 | 2/1989 | Fujinaka et al. | 428/631 |

OTHER PUBLICATIONS

"Ceramic Materials for Electroncs", edited by Relva C. Buchanan, Electrical Engineering and Electroncs/31, 1986, pp. 402–425.

Primary Examiner—Ellis P. Robinson
Assistant Examiner—Archene A. Turner
Attorney, Agent, or Firm—Parkhurst, Wendel & Rossi

[57] ABSTRACT

A ceramic green sheet comprises a green sheet as a core and a surface layer formed thereon. Such ceramic green sheets are laminated for use in IC package, printed circuit board or the like.

9 Claims, 3 Drawing Sheets

FIG_1a
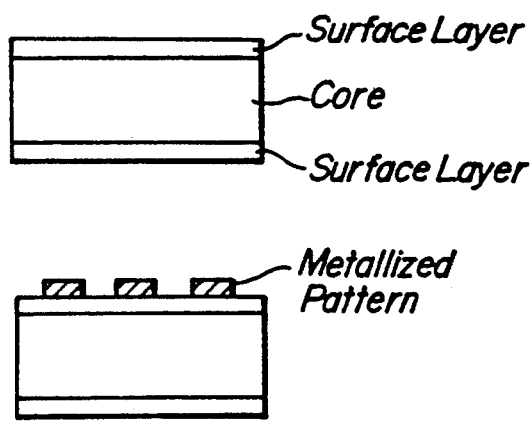
FIG_1b
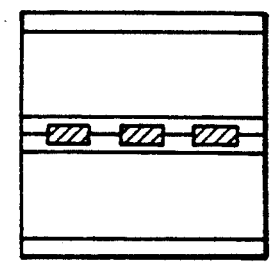
FIG_2
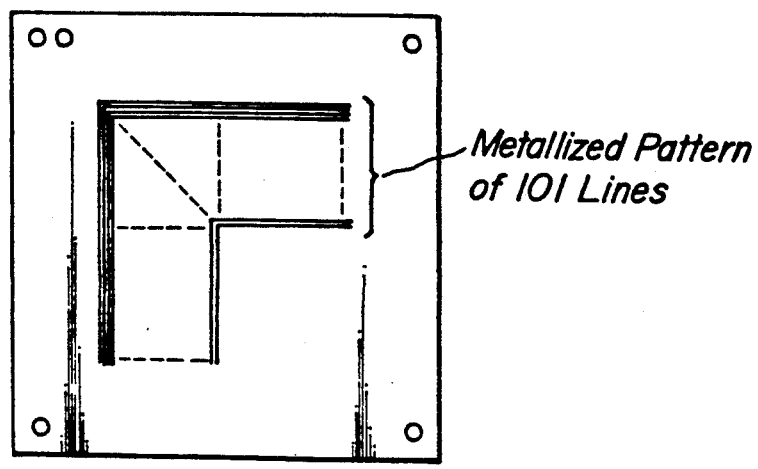

FIG_5a
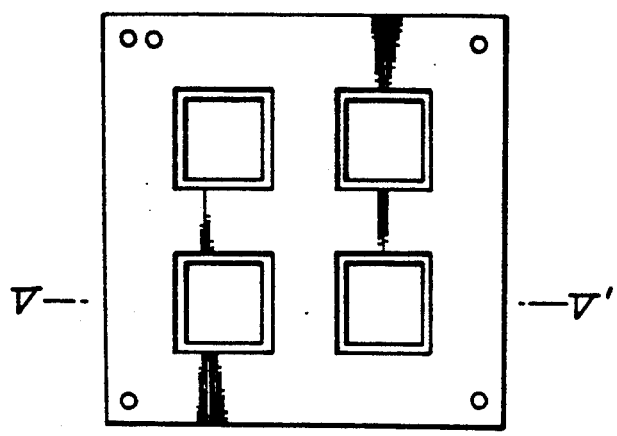
FIG_5b
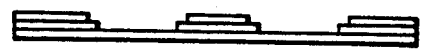
FIG_6a
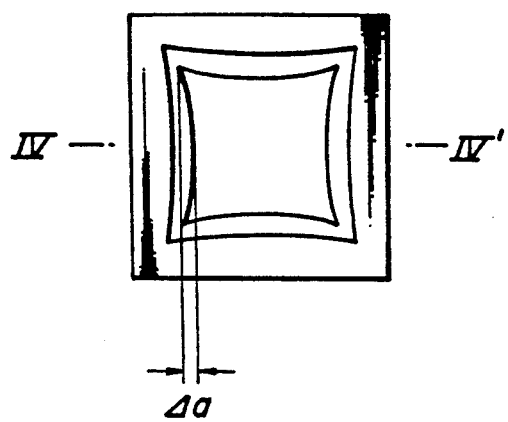
FIG_6b

CERAMIC GREEN SHEETS

BACKGROUND OF THE INVENTION

1. Field of the Invention

This invention relates to ceramic green sheets, and more particularly to a ceramic green sheet used for laminating a plurality of ceramic green sheets one upon the other.

2. Related Art Statement

Heretofore, the IC package, printed circuit board or the like has been frequently manufactured by laminating a plurality of ceramic green sheets one upon the other. This lamination is usually carried out by piling the ceramic green sheets one upon the other and bonding them through pressing at a heated state by means of a pressing machine or the like.

As the lamination through heating and pressing, there is a method of laminating a plurality ceramic green sheets at the piled state. However, in order to increase the bonding property and achieve the stable lamination, there has been proposed a method wherein the lamination is carried out after an organic solvent, a solvent dissolving a binder, a plasticizer or the like is applied to a surface of the ceramic green sheet, a method of heating and pressing a laminate of ceramic green sheets in an atmosphere of an organic solvent gas, and the like.

In the method of applying the organic solvent or the like, however, the stability is lost with the lapse of time due to the evaporation of the applied solvent. On the other hand, it is difficult to perform the method of laminating in the solvent gas atmosphere from a viewpoint of the equipment.

Further, a metallized paste for the formation of electric conductor is frequently formed on the green sheet to be laminated through printing or the like. Particularly, it is required to make the metallized pattern fine and highly dense. For example, when the pattern has line a width/spacing of about 100 μm/80 μm, it is difficult to conduct the bonding without forming a gap between the metallized lines. In this case, it is possible to remove the gap by raising the lamination pressure, but such a high pressure increases the density of the green sheet and generates scattering of the green sheet density to deform the laminated assembly at the green state, which causes problems such as change of shrinkage during firing, shape warp of the fired product and the like, and consequently products can not be produced with high accuracy.

SUMMARY OF THE INVENTION

It is, therefore, an object of the invention to provide a ceramic green sheet which can easily and stably perform the lamination without forming the gap even in the formation of a fine metallized pattern under a pressure not changing the density of the green sheet nor deforming the green sheet.

According to the invention, there is the provision of a ceramic green sheet comprising a green sheet as a core for maintaining a shape thereof and a surface layer formed on a surface of said green sheet as a lamination assisting layer.

BRIEF DESCRIPTION OF THE DRAWINGS

FIGS. 1a and 1b are conceptionally schematically sectional views of embodiments of the ceramic green sheet printed with a metallized pattern according to the invention, respectively;

FIG. 2 is a plan view of an embodiment of the green sheet according to the invention;

FIGS. 5a and 5b are plan and sectional views of another embodiment of the green sheet according to the invention, respectively; and FIGS. 6a and 6b are plan and sectional views showing deformation amounts to be measured, respectively.

DESCRIPTION OF THE PREFERRED EMBODIMENTS

Figure 3:
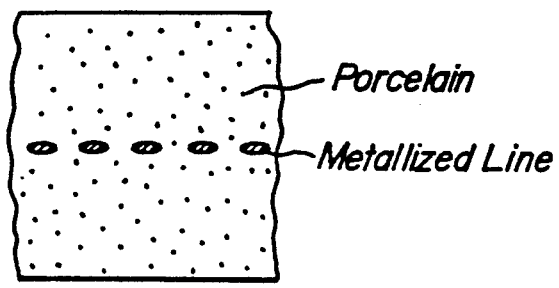
FIG. 3 is a sectional view showing a lamination state of green sheets according to the invention.

In the ceramic green sheet of the aforementioned structure according to the invention, when laminating the green sheets, the very fine and high density metallized pattern can be embedded in the surface layer formed on the green sheet surface without forming the gap even under a relatively low pressure.

As the ceramic component of the ceramic green sheet, there are alumina usually used in the manufacture of IC package, printed circuit board or the like; glass filler, crystallized glass, mullite and other ceramic mixture for the purpose of reducing the dielectricity or conducting low temperature firing; aluminum nitride having a high thermal conductivity and the like, which are applicable to the green sheet according to the invention. Such a ceramic component is mixed with a resin as a binder to form a green sheet as a core. As a method of forming the green sheet, a doctor blade method is usual and preferable, but an extrusion method, roll coater method and the like may be used. Moreover, the thickness of the green sheet capable of being formed by the doctor blade method is usually about 100–1200 μm, which is frequently applied to the green sheet used in the production of the IC package, printed circuit board or the like.

Then, a surface layer is formed on the surface of the green sheet as a core. The formation of the surface layer is carried out by mixing a ceramic component with a resin as a binder and then applying it to the surface of the green sheet as a core. As the application means, a roll coater is preferable because of uniform application, and particularly the use of a reverse roll coater is favorable because the uniform application can be achieved without being influenced by the scattering of the thickness of the green sheet as the core. And also, the doctor blade process is favorable because the application can be carried out under a tension somewhat applied to the green sheet. Further, a screen printing process, spraying process, process of penetrating slurry and the like may be used. In any case, the surface layer may be formed on one-side surface or both-side surfaces of the green sheet as the core. Moreover, in order to stably and surely conduct the lamination with sandwiching the fine metallized pattern, it is preferable to form the surface layer on both-side surfaces of the green sheet.

The metallized pattern is formed on the green sheet by using a paste containing metallic powder such as W, Mo, Cu, Ni, Ag or the like through a screen printing process or the like. In this case, the metallized pattern may be formed on the green sheet as a core or the surface layer. The metallized pattern has usually a thickness of about 5–30 μm, so that the thickness of the surface layer is desirable to be 5–80 μm for completely absorbing the thickness of the metallized pattern in the lamination. When the green sheets are laminated so as to sandwich the metallized pattern therebetween, it is important that the thickness of the metallized pattern is absorbed by the deformation of the surface layer and the deformation is not affected to the green sheet as the core. For this end, it is favorable that the surface layer having a rich flexibility is formed at a thickness larger than that of the metallized pattern. On the other hand, when the thickness of the surface layer is too thick, the properties of the surface layer badly affects the flexibility of the ceramic green sheet, the deformation state of the sheets in the lamination and the like.

Moreover, it is desirable that the ceramic component in the ceramic green sheet as a core is substantially the same as the ceramic component of the surface layer for the uniformization of the product composition. The term "substantially the same" used herein means that both the ceramic components are prepared by the same composition system and may not completely be the same. On the other hand, a material having different properties is able to be formed in the laminate, and in this case, both ceramic components may be different. For example, a material having different dielectricity, thermal conductivity, mechanical strength or the like may be formed in the middle or surface portion of the laminate.

As the organic binder used in the shaping, use may be made of resins for shaping the green sheet as a core and/or resins for shaping the surface layer, such as polyvinyl butyral (PVB), ethylcellulose, acrylic resin, hydrocarbon resin and the like. Among them, the use of acrylic resin is preferable because it can adjust the flexibility of the green sheet and/or surface layer without a plasticizer and is good in the binder burnout property during the firing. The acrylic resin is a polymer consisting mainly of acrylic acid and/or methacrylic acid series monomer such as acrylic acid, methyl acrylate, ethyl acrylate, methacrylic acid, methyl methacrylate, ethyl methacrylate or the like.

When the combination of the resin for the green sheet and the resin for the surface layer is a combination of organic solvent soluble resin and water soluble resin, it is advantageous that these resins are not influenced by each other when the surface layer is formed on the green sheet as the core. In any case, the resin for the green sheet and the resin for the surface layer can properly be used in accordance with the properties required in these resins.

In the green sheet as a core, the resin is added in an amount of about 3–30 parts by weight per 100 parts by weight of the ceramic component. When the green sheet is formed by the doctor blade process, the amount of resin added is about 3–15 parts by weight. On the other hand, in the formation of the surface layer, the resin is added in an amount of 3–50 parts by weight per 100 parts by weight of the ceramic component. In order to improve the adhesion property in the lamination, it is preferable that the amount of the resin in the surface layer is made larger than that in the green sheet, or that the plasticizer is added in the surface layer when the plasticizer is not included in the green sheet or the amount of the plasticizer added to the surface layer is increased when the plasticizer is included in the green sheet. Thus, the flexibility is increased in the surface layer rather than in the green sheet as a core to facilitate the adhesion as well as embedding of gaps in fine metallized pattern. Similarly, in order to make the surface layer more flexible than the green sheet, the resin used in the surface layer is effective to have a glass transition temperature (Tg) lower than that of the resin used in the green sheet, or the glass transition temperature may be substantially reduced by adding the plasticizer when using the resin having the same glass transition temperature. Particularly, it is more effective to form the surface layer by mixing the resin having a low glass transition temperature with the plasticizer. Further, the resin used in the surface layer is effective to have a molecular weight lower than that in the green sheet. In any case, it is considered that when using the resin having a low glass transition temperature or a low molecular weight, the movement of the resin as a binder is easy in the lamination to develop the adhesion property.

Moreover, the plasticizer may be applied to the surface layer having the above composition after the formation of the metallized pattern on the surface layer through printing process or the like, if necessary, and before the lamination. In this case, the amount of the plasticizer included in the surface layer can previously be reduced or be made zero, and consequently it is prevented to cause a problem of lowering the strength of the green sheet by the influence of the plasticizer included in the surface layer.

The green sheet provided with the surface layer may advantageously be subjected to a working for microhole formation by simultaneously punching plural micro through-holes having, for example, a hole diameter of 150 μm and a pitch of 300 μm with a mold. That is, even when cracks are formed between the holes in the green sheet having no surface layer, the presence of the surface layer prevents the formation of cracks.

The following examples are given in illustration of the invention and are not intended as limitations thereof.

EXAMPLE 1

A resin as a binder, a plasticizer and a solvent were added to a ceramic mixture powder consisting of 90% by weight of alumina, 7% by weight of a mixture of clay mineral, silica sand, magnesium carbonate and calcium carbonate and 3% by weight in total of chromium oxide and titanium oxide, which were mixed in a pot mill to form a slurry. After the viscosity of the slurry was adjusted by defoaming under vacuum, the slurry was cast into a green sheet as a core by the doctor blade process. The kind and amount of the resin and the kind and amount of the solvent are shown in the following Table 1.

To the same ceramic mixture powder as mentioned above were added a resin as a binder, a plasticizer and a solvent, which were mixed in a pot mill to form a slurry for the formation of a surface layer. The kind and amount of the resin and the kind and amount of the solvent are shown in the following Table 2.

TABLE 1

| No. | Kind of resin | Tg of resin (°C.) | Molecular weight of resin | Amount of resin added (1) (part by weight) | Kind of plasticizer | Amount of plasticizer added (1) (part by weight) | Kind of solvent |
| --- | --- | --- | --- | --- | --- | --- | --- |
| 1-1 | polyvinyl | +65 | 80000 | 7 | DOP | 3 | mixture of toluene |

TABLE 1-continued

| No. | Kind of resin | Tg of resin (°C.) | Molecular weight of resin | Amount of resin added (1) (part by weight) | Kind of plasticizer | Amount of plasticizer added (1) (part by weight) | Kind of solvent |
|---|---|---|---|---|---|---|---|
| 1-2 | butyral acrylic resin | +5 | 300000 | 8 | — | — | and butanol mixture of toluene and ethyl acetate |
| 1-3 | acrylic resin | +30 | 200000 | 6 | DBP | 1.5 | mixture of xylene and ethyl acetate |
| 1-4 | acrylic resin | +40 | 250000 | 7 | PEG | 2 | water |

(1) part by weight per 100 parts by weight of powdery ceramic component

TABLE 2

| No. | Kind of resin | Tg of resin (°C.) | Molecular weight of resin | Amount of resin added (1) (part by weight) | Kind of plasticizer | Amount of plasticizer added (1) (part by weight) | Kind of solvent |
|---|---|---|---|---|---|---|---|
| 2-1 | polyvinyl butyral | +65 | 50000 | 15 | DOP | 6 | mixture of toluene and ethanol |
| 2-2 | acrylic resin | +5 | 300000 | 40 | — | — | mixture of toluene and butanol |
| 2-3 | acrylic resin | +5 | 300000 | 8 | DOP | 10 | mixture of toluene and butanol |
| 2-4 | acrylic resin | −10 | 300000 | 25 | DBP | 3 | mixture of toluene and ethyl acetate |
| 2-5 | acrylic resin | −20 | 200000 | 15 | — | — | mixture of xylene and butyl acetate |
| 2-6 | acrylic resin | +40 | 50000 | 20 | DBS | 5 | mixture of toluene and ethanol |
| 2-7 | acrylic resin | +40 | 250000 | 20 | PEG | 15 | water |

(1) part by weight per 100 parts by weight of powdery ceramic component

The slurry of Table 2 was applied to the green sheet of Table 1 according to a combination shown in the following Table 3. The application of the slurry onto the green sheet was carried out by means of a reverse roll coater. Immediately after the application, the green sheet coated with the slurry was placed in a dryer held at a temperature of 100°-150° C. and dried for 2-10 minutes. The "both-side surfaces" in Table 3 means that the front and rear side surfaces of the green sheet were coated with the slurry by repeating the above application method two times. The coated thickness is also shown in Table 3. Moreover, an example of the green sheet having no surface layer is shown as a comparative example in Table 3.

The green sheet of Table 3 was punched out into a square having a side of 70 mm, onto which was printed a W paste through screen printing into a pattern of 101 lines having a line width of 120 μm and a spacing of 80 μm as shown in FIG. 2. Then the green sheet not printed having the same size was piled on the printed surface of the green sheet and then laminated by heating and pressing under lamination conditions as shown in the following Table 4, and the resulting laminate was fired at 1,550° C. in a mixed gas of $N_2$ and $H_2$ having a dew point of 35° C. to form a ceramic substrate. Moreover, the conceptionally sectional view of the green sheet printed in the metallized pattern according to the invention is shown in FIG. 1a, and the conceptionally sectional view of the ceramic sheet obtained by laminating the green sheets of FIG. 1a is shown in FIG. 1b. In

TABLE 3

| No. | No. of green sheet as a core | Slurry used as surface layer | Applied surface | Coated thickness per one-side surface (μm) |
|---|---|---|---|---|
| 3-1 | 1-1 | 2-1 | one-side surface | 40 |
| 3-2 | 1-1 | 2-4 | one-side surface | 20 |
| 3-3 | 1-2 | 2-1 | both-side surfaces | 40 |
| 3-4 | 1-2 | 2-2 | both-side surfaces | 30 |
| 3-5 | 1-2 | 2-3 | both-side surfaces | 25 |
| 3-6 | 1-2 | 2-3 | one-side surface | 100 |
| 3-7 | 1-2 | 2-4 | both-side surfaces | 20 |
| 3-8 | 1-2 | 2-4 | one-side surface | 40 |
| 3-9 | 1-2 | 2-5 | both-side surfaces | 30 |
| 3-10 | 1-2 | 2-6 | both-side surfaces | 30 |
| 3-11 | 1-2 | 2-7 | both-side surfaces | 30 |
| 3-12 | 1-3 | 2-3 | both-side surfaces | 30 |
| 3-13 | 1-3 | 2-4 | both-side surfaces | 20 |
| 3-14 | 1-3 | 2-4 | both-side surfaces | 5 |
| 3-15 | 1-3 | 2-4 | one-side surface | 10 |
| 3-16 | 1-4 | 2-4 | both-side surfaces | 40 |
| 3-17 | 1-4 | 2-7 | both-side surfaces | 40 |
| 3-18 | 1-1 | — | — | — |
| 3-19 | 1-2 | — | — | — |

FIG. 1, the surface layer is formed on both-side surfaces of the green sheet.

Figure 4:
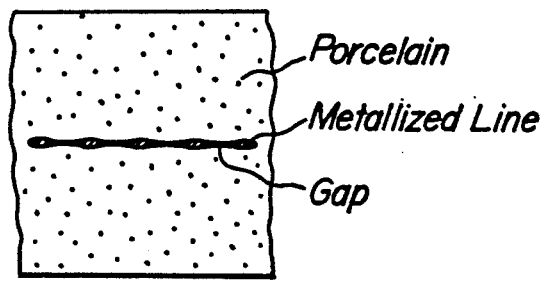
FIG. 4 is a sectional view showing a lamination state of the conventional green sheets.

When the resulting ceramic sheet or porcelain was cut to observe lines of the W metallized pattern by means of a microscope, the ceramic substrate made from the green sheets according to the invention exhibits a good lamination state that gaps are completely embedded between the metallized lines as shown in FIG. 3, while the ceramic sheet made from the green sheets outside the invention has many gaps between the metallized lines as shown in FIG. 4.

TABLE 4

| No. | Lamination conditions | |
|---|---|---|
| | temperature (°C.) | pressure (kg/cm²) |
| 3-1 | 80 | 15 |
| 3-2 | 80 | 20 |
| 3-3 | 80 | 15 |
| 3-4 | 80 | 20 |
| 3-5 | 70 | 10 |
| 3-6 | 70 | 20 |
| 3-7 | 60 | 5 |
| 3-8 | 60 | 10 |
| 3-9 | 50 | 10 |
| 3-10 | 70 | 10 |
| 3-11 | 90 | 30 |
| 3-12 | 70 | 10 |
| 3-13 | 60 | 5 |
| 3-14 | 60 | 15 |
| 3-15 | 60 | 15 |
| 3-16 | 60 | 10 |
| 3-17 | 90 | 20 |
| 3-18 | 110 | 80 |

TABLE 4-continued

| No. | Lamination conditions | |
|---|---|---|
| | temperature (°C.) | pressure (kg/cm²) |
| 3-19 | 120 | 100 |

EXAMPLE 2

A resin as a binder, a plasticizer and a solvent as shown in the following Table 5 were added to 100 parts by weight of a ceramic powder consisting of 40% by weight of alumina, 40% by weight of borosilicate glass and 20% by weight of quartz glass, which were mixed in a pot mill, defoamed under vacuum, and then casted into a green sheet as a core by the doctor blade process. Separately, the ceramic powder having the same composition as mentioned above was added with a resin as a binder, a plasticizer and a solvent as shown in the following Table 6 and mixed in a pot mill to form a slurry for the formation of a surface layer. Then, the slurry was applied to the surface of the green sheet with a doctor blade. The combination of the green sheet as a core and the slurry for the formation of surface layer, the applied surface and the coated thickness are shown in the following Table 7. In Table 7 is also shown an example of the green sheet having no surface layer as a comparative example.

TABLE 5

| No. | Kind of resin | Tg of resin (°C.) | Amount of resin added (1) (part by weight) | Kind of plasticizer | Amount of plasticizer added (1) (part by weight) | Kind of solvent |
|---|---|---|---|---|---|---|
| 5-1 | polystyrene | +20 | 8 | DOP | 1 | mixture of toluene and methyl ethyl ketone |
| 5-2 | polynorbornene | +15 | 7 | — | — | toluene |
| 5-3 | acrylic resin | +20 | 7 | DBS | 2 | mixture of toluene and ethyl acetate |

(1) part by weight per 100 parts by weight of powdery ceramic component

TABLE 6

| No. | Kind of resin | Tg of resin (°C.) | Amount of resin added (1) (part by weight) | Kind of plasticizer | Amount of plasticizer added (1) (part by weight) | Kind of solvent |
|---|---|---|---|---|---|---|
| 6-1 | polystyrene | +20 | 20 | DOP | 5 | mixture of toluene and ethyl acetate |
| 6-2 | polynorbornene | +15 | 25 | DOP | 10 | xylene |
| 6-3 | acrylic resin | +20 | 15 | DBS | 7 | mixture of toluene and ethyl acetate |
| 6-4 | acrylic resin | −10 | 20 | — | — | mixture of toluene and butanol |

(1) part by weight per 100 parts by weight of powdery ceramic component

TABLE 7

| No. | No. of green sheet as a core | Slurry used as surface layer | Applied surface | Coated thickness per one-side surface (μm) |
|---|---|---|---|---|
| 7-1 | 5-1 | 6-1 | both-side surfaces | 25 |
| 7-2 | 5-2 | 6-2 | both-side surfaces | 30 |
| 7-3 | 5-2 | 6-2 | one-side surface | 50 |
| 7-4 | 5-3 | 6-3 | both-side surfaces | 15 |
| 7-5 | 5-3 | 6-3 | one-side surface | 40 |
| 7-6 | 5-3 | 6-4 | both-side surfaces | 20 |
| 7-7 | 5-2 | — | — | — |

The green sheet of Table 7 was punched out into a square having a side of 70 mm, onto which was printed a Cu paste in the same pattern as in Example 1 through screen printing and further piled an unprinted green sheet. The resulting assembly was laminated by heating and pressing under lamination conditions as shown in the following Table 8. The resulting laminate was fired at 1,000° C. in an atmosphere of N₂ gas having a dew point of 30° C. The thus obtained ceramic substrate was cut to observe the Cu metallized pattern. As a result, the ceramic substrate made from the green sheets according to the invention has no gap between the metallized lines likewise Example 1, while many gaps are existent between the metallized lines in the substrate made from the green sheet outside the invention.

tion of surface layer, the applied surface and the coated thickness are shown in the following Table 11.

TABLE 9

| No. | Kind of resin | Tg of resin (°C.) | Amount of resin added (1) (part by weight) | Kind of plasticizer | Amount of plasticizer added (1) (part by weight) | Kind of solvent |
| --- | --- | --- | --- | --- | --- | --- |
| 9-1 | polynorbornene | +15 | 8 | — | — | mixture of toluene and methyl ethyl ketone |
| 9-2 | acrylic resin | 0 | 7 | — | — | mixture of xylene and ethanol |

(1) part by weight per 100 parts by weight of powdery ceramic component

TABLE 10

| No. | Kind of resin | Tg of resin (°C.) | Amount of resin added (1) (part by weight) | Kind of plasticizer | Amount of plasticizer added (1) (part by weight) | Kind of solvent |
| --- | --- | --- | --- | --- | --- | --- |
| 10-1 | polynorbornene | +15 | 30 | DOP | 3 | toluene |
| 10-2 | acrylic resin | −10 | 20 | DBP | 5 | mixture of toluene and ethanol |

(1) part by weight per 100 parts by weight of powdery ceramic component

TABLE 11

| No. | No. of green sheet as a core | Slurry used as surface layer | Applied surface | Coated thickness per one-side surface (μm) |
| --- | --- | --- | --- | --- |
| 11-1 | 9-1 | 10-1 | both-side surfaces | 30 |
| 11-2 | 9-2 | 10-2 | both-side surfaces | 20 |
| 11-3 | 9-2 | — | — | — |

TABLE 8

| | Lamination conditions | |
| --- | --- | --- |
| No. | temperature (° C.) | pressure (kg/cm²) |
| 7-1 | 80 | 20 |
| 7-2 | 70 | 10 |
| 7-3 | 70 | 20 |
| 7-4 | 60 | 5 |
| 7-5 | 60 | 10 |
| 7-6 | 50 | 10 |
| 7-7 | 120 | 150 |

The green sheet of Table 11 was punched out into a square having a side of 70 mm, onto which was printed a W paste in the same pattern as in Example 1 through screen printing and further piled an unprinted green sheet. The resulting assembly was laminated by heating and pressing under lamination conditions as shown in the following Table 12. The resulting laminate was fired at 1,800° C. in an atmosphere of N₂ gas. The thus obtained ceramic substrate was cut to observe the W metallized pattern. As a result, the ceramic substrate made from the green sheets according to the invention has no gap between the metallized lines likewise Example 1, while many gaps are existent between the metallized lines in the substrate made from the green sheet outside the invention.

TABLE 12

| | Lamination conditions | |
| --- | --- | --- |
| No. | temperature (° C.) | pressure (kg/cm²) |
| 12-1 | 80 | 15 |
| 12-2 | 60 | 10 |
| 12-3 | 120 | 80 |

EXAMPLE 3

A resin as a binder, a plasticizer and a solvent as shown in the following Table 9 were added to 100 parts by weight of a ceramic powder consisting of 99% by weight of aluminum nitride and 1% by weight of calcium carbonate, which were mixed in a pot mill, defoamed and cast into a green sheet as a core through the doctor blade process. Separately, the ceramic powder having the same composition as mentioned above was added with a resin as a binder, a plasticizer and a solvent as shown in the following Table 10, which were mixed in a pot mill to form a slurry for the formation of a surface layer. This slurry was applied to the green sheet as a core by means of a reverse roll coater. The combination of the green sheet and the slurry for the forma-

EXAMPLE 4

To the surface of the green sheet made from the ceramic powder as in Example 1 was applied the same slurry for the formation of the surface layer as in Example 1. The thus treated green sheet was used to obtain a laminate composed of three green sheets having a window frame for a package or a chip carriers as shown in FIG. 5. In this case, FIG. 5a is a plan view of the laminate and FIG. 5b is a sectional view thereof, which show a pattern taking 4 chip carrier. The lamination was carried out by piling a first layer on a second layer and then piling a third layer thereon. The combination of the green sheet as a core and the slurry for the formation of surface layer and lamination conditions are shown in the following Table 13. No. described in the column "combination" of Table 13 corresponds to No. of Tables 3 and 4 in Example 1.

TABLE 13

| No. | Combination of green sheet as a core and slurry as a surface layer, and lamination conditions | Deformation amount of window frame (Δa) (μm) | Deformation amount of bottom (Δb) (μm) |
| --- | --- | --- | --- |
| 13-1 | 3-1 | 23 | 56 |
| 13-2 | 3-5 | 19 | 40 |
| 13-3 | 3-7 | 6 | 8 |
| 13-4 | 3-18 | 67 | 121 |
| 13-5 | 3-19 | 62 | 107 |

After the lamination, deformation amount of window frame (Δa) as shown in FIG. 6a and deformation amount of bottom (Δb) as shown in FIG. 6b were measured. FIG. 6 shows a one of chip carriers cut out from the pattern shown in FIG. 5, wherein the deformation state in the window frame and the bottom is exaggeratedly shown. The respective deformation amount is also shown in Table 13. As seen from Table 13, when the lamination is carried out by using the green sheet according to the invention, the deformation amounts of the window frame and the bottom are less than those of the case using the conventional green sheet.

As mentioned above, the green sheet provided with the surface layer for the lamination according to the invention can fill up gaps between lines of the very fine and high density metallized pattern even when the green sheets are laminated under a relatively low pressure for the manufacture of IC package, printed circuit board or the like. Further, the deformation of IC package or the like at green state or fired state is less and it is effective to prevent the occurrence of cracks when plural fine through-holes are formed in the green sheet through the punching. Therefore, the invention is very valuable in industry.

What is claimed is:

1. A ceramic green sheet for use in laminating a metallized pattern between respective ceramic green sheets, wherein no gaps exist between portions of said metallized pattern, said ceramic green sheet comprising a green sheet as a core for maintaining a shape thereof and a green surface layer formed on at least one surface of said green sheet as a lamination assisting layer, wherein said green surface layer is more flexible than said green sheet as a core.

2. The ceramic green sheet according to claim 1, wherein said green sheet as a core is formed by a doctor blade process and said surface layer is applied by means of a roll coater.

3. The ceramic green sheet according to claim 1, wherein a ceramic component of said green sheet as a core has substantially the same composition as that of a ceramic component of said surface layer.

4. The ceramic green sheet according to claim 1, wherein said green sheet as a core includes an acrylic resin as an organic binder.

5. The ceramic green sheet, according to claim 1, wherein said surface layer includes an acrylic resin as an organic binder.

6. The ceramic green sheet according to claim 1, wherein an amount of resin included in said surface layer is greater than an amount of resin included in said green sheet as a core.

7. The ceramic green sheet according to claim 1, wherein a resin included in said surface layer has a lower glass transition point than a resin included in said green sheet as a core.

8. The ceramic green sheet according to claim 1, wherein said surface layer is formed on both side surfaces of said green sheet as a core.

9. The ceramic green sheet according to claim 1, wherein said green sheet as a core has a thickness of 100–1200 μm and said surface layer has a thickness of 5–80 μm.

* * * * *